US012598840B2

(12) United States Patent
Feng et al.

(10) Patent No.: US 12,598,840 B2
(45) Date of Patent: Apr. 7, 2026

(54) LIGHT-EMITTING DIODE

(71) Applicant: Quanzhou Sanan Semiconductor Technology Co., Ltd., Nanan (CN)

(72) Inventors: Yanbin Feng, Fujian (CN); Wenhao Gao, Fujian (CN); Qian Liang, Fujian (CN); Chaoyu Wu, Fujian (CN)

(73) Assignee: QUANZHOU SANAN SEMICONDUCTOR TECHNOLOGY CO., LTD., Nanan City (CN)

( * ) Notice: Subject to any disclaimer, the term of this patent is extended or adjusted under 35 U.S.C. 154(b) by 541 days.

(21) Appl. No.: 17/969,122

(22) Filed: Oct. 19, 2022

(65) Prior Publication Data

US 2023/0207728 A1     Jun. 29, 2023

(30) Foreign Application Priority Data

Dec. 27, 2021    (CN) .......................... 202111617602.8

(51) Int. Cl.
H10H 20/81          (2025.01)
H10H 20/815        (2025.01)
H10H 20/824        (2025.01)

(52) U.S. Cl.
CPC ........ H10H 20/815 (2025.01); H10H 20/824 (2025.01)

(58) Field of Classification Search
CPC .. H10H 20/815; H10H 20/824; H10H 20/816; H10H 20/81
See application file for complete search history.

(56) References Cited

U.S. PATENT DOCUMENTS 5,466,950 A * 11/1995 Sugawara ............ H10H 20/816
257/97
2022/0285583 A1* 9/2022 Hsiao ................. H10H 20/0137

FOREIGN PATENT DOCUMENTS

AT          519500 A1 * 7/2018    ......... H01L 33/0075
DE          3235210 A1 * 4/1983

* cited by examiner

*Primary Examiner* — Monica D Harrison
*Assistant Examiner* — David M Helberg
(74) *Attorney, Agent, or Firm* — MUNCY, GEISSLER, OLDS & LOWE, P.C.

(57)          ABSTRACT

A light-emitting diode includes a semiconductor epitaxial structure that has a first current spreading layer, a first transition layer, a first cladding layer, a second transition layer, a first confinement layer, an active layer, a second confinement layer, a second cladding layer, and a second current spreading layer. The first current spreading layer, the first cladding layer, and the first confinement layer independently have semiconductor materials that are different in an aluminum content. An aluminum content of the first transition layer increases in a direction from the first current spreading layer to the first cladding layer. An aluminum content of the second transition layer decreases in a direction from the first cladding layer to the first confinement layer.

17 Claims, 5 Drawing Sheets

1111
1110
1109
1108
1107
1106
1105
1104
1103
1102
1101
1100

111
110
109
108
107
106
113
105
112
104
103
102
101
100

LIGHT-EMITTING DIODE

CROSS-REFERENCE TO RELATED APPLICATION

This application claims priority to Chinese Invention Patent Application No. 202111617602.8, filed on Dec. 27, 2021, which is incorporated herein by reference in its entirety.

FIELD

The disclosure relates to a light-emitting diode and a production method thereof.

BACKGROUND

Light-emitting diodes (LEDs) are considered to be one of the light sources having the most potential as they offer advantages including high luminous intensity, high efficiency, small size, and long lifespan. In particular, infrared light-emitting diodes (IR LEDs) are widely applied in various fields, such as security surveillance systems, wearable devices, space communication systems, remote control, medical appliances, light sources of sensors, night lighting systems, etc., for having advantageous characteristics, e.g., specific waveband, low power consumption, and high reliability.

Referring to FIG. 1, a conventional light-emitting unit includes a growth substrate 1100 and a semiconductor epitaxial structure formed on the growth substrate 1100. The semiconductor epitaxial structure includes a first current spreading layer 1104, a first cladding layer 1105, a first confinement layer 1106, an active layer 1107, a second confinement layer 1108, a second cladding layer 1109, a second current spreading layer 1110, and a second ohmic contact layer 1111 that are sequentially disposed in such order on the growth substrate 1100.

In the semiconductor epitaxial structure of the conventional light-emitting unit, aluminum contents of the first current spreading layer 1104, the first cladding layer 1105, and the first confinement layer 1106 are different, which causes lattice mismatch and relative large bandgap difference, and in turn leads to large stress between the layers, such that a large amount of defects exists between the first current spreading layer 1104 and the first cladding layer 1105, and between the first cladding layer 1105 and the first confinement layer 1106.

Such defects may adversely affect the performance of a light-emitting diode in withstanding exposures to high and low temperature extremes under a power and temperature cycling test, thereby severely reducing the lighting efficiency and lifespan of the light-emitting diode.

SUMMARY

Therefore, an object of the disclosure is to provide a light-emitting diode and a production method thereof that can alleviate or overcome at least one of the aforesaid shortcomings of the prior art.

According to an aspect of the disclosure, a light-emitting diode includes a semiconductor epitaxial structure that has a first surface and a second surface opposite to the first surface, and that includes a first current spreading layer, a first transition layer, a first cladding layer, a second transition layer, a first confinement layer, an active layer, a second confinement layer, a second cladding layer, and a second current spreading layer disposed sequentially in such order from the first surface to the second surface. The first current spreading layer, the first cladding layer, and the first confinement layer independently have semiconductor materials that are different in an aluminum content. The first transition layer has aluminum, and in the first transition layer, an aluminum content increases in a direction from the first current spreading layer to the first cladding layer. The second transition layer has aluminum, and in the second transition layer, an aluminum content decreases in a direction from the first cladding layer to the first confinement layer.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
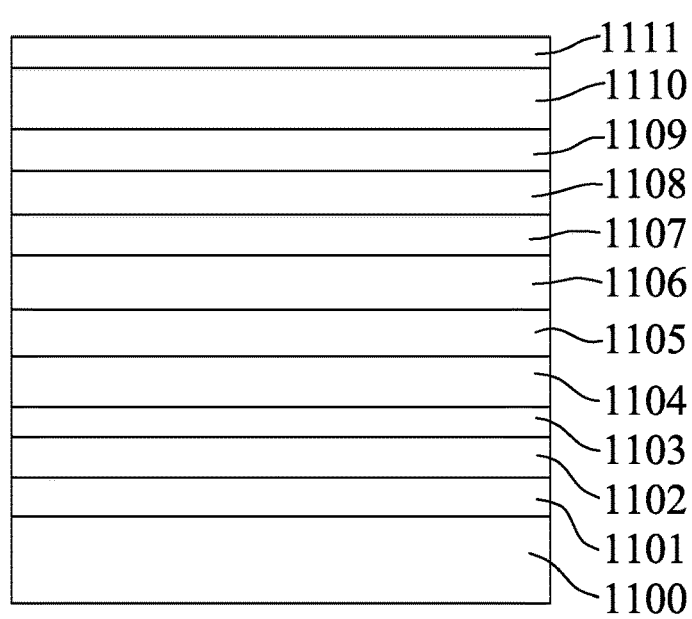
FIG. 1 is a schematic view illustrating a conventional light-emitting unit.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
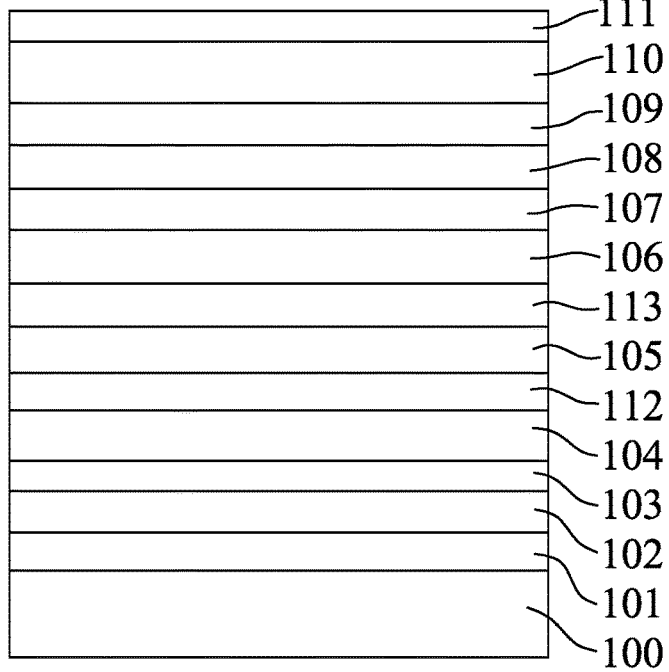
FIG. 2 is a schematic view illustrating a first embodiment of a light-emitting unit containing a semiconductor epitaxial structure according to the disclosure.

Referring to FIG. 2, a first embodiment of a light-emitting unit according to the disclosure includes a growth substrate 100, and a semiconductor epitaxial structure that includes a first current spreading layer 104, a first transition layer 112, a first cladding layer 105, a second transition layer 113, a first confinement layer 106, an active layer 107, a second confinement layer 108, a second cladding layer 109, a second current spreading layer 110, and a second ohmic contact layer 111 disposed sequentially in such order on the growth substrate 100.

The growth substrate 100 may be made of gallium arsenide, gallium phosphide or indium phosphide, but is not limited to. In this embodiment, the growth substrate is made of gallium arsenide. As shown in FIG. 2, the light-emitting unit may further include a buffer layer 101, an etch stop layer 102, and a first ohmic contact layer 103 disposed sequentially in such order on the growth substrate 100 and located between the growth substrate 100 and the first current spreading layer 104. Because the quality of lattice of the buffer layer 101 is better than that of the growth substrate 100, forming the buffer layer 101 on the growth substrate 100 may alleviate adverse effects of the lattice defects of the growth substrate 100 on the semiconductor epitaxial structure. The etch stop layer 102 serves to stop etching in later procedures. In certain embodiments, the etch stop layer 102 is an n-type etch stop layer made of n-type gallium indium phosphide. To facilitate a later removal of the growth substrate 100, the etch stop layer 102 has a thickness that is greater than 0 nm and no greater than 500 nm. In some embodiments, the thickness of the etch stop layer 102 is greater than 0 nm and no greater than 200 nm. The first ohmic contact layer 103 may be made of gallium arsenide, and may have a thickness ranging from 10 nm to 100 nm and a doping concentration ranging from $1E18/cm^3$ to $10E18/cm^3$. In some embodiments, the doping concentration of the first ohmic contact layer 103 is $2E18/cm^3$ so as to achieve better ohmic contact. The first ohmic contact layer 103 may be an n-type doped gallium arsenide.

The semiconductor epitaxial structure may be formed on the growth substrate 100 by using methods such as physical vapor deposition (PVD), chemical vapor deposition (CVD), epitaxy growth technology, atomic layer deposition (ALD), etc.

The semiconductor epitaxial structure may contain a semiconductor material that generates light, such as ultraviolet light, blue light, green light, yellow light, red light, and infrared light. Specifically, the semiconductor material of the semiconductor epitaxial structure may be a material that generates a peak wavelength ranging from 500 nm to 950 nm, such as an arsenide material. In certain embodiments, the semiconductor epitaxial structure may be an AlGaInP-based laminate or an AlGaAs-based laminate that generates light having a peak wavelength ranging from 550 nm to 1000 nm. In this embodiment, the semiconductor epitaxial structure is an AlGaAs-based laminate and generates invisible light having a peak wavelength ranging from 750 nm to 1000 nm.

The first current spreading layer 104, the first cladding layer 105, and the first confinement layer 106 independently have semiconductor materials that are different in an aluminum content.

The first current spreading layer 104 performs a function of current spreading, and the effectiveness of the current spreading function is related to a thickness of the first current spreading layer 104. In this embodiment, the thickness of the first current spreading layer 104 may vary based on the size of the light-emitting diode. In some embodiments, the thickness of the first current spreading layer 104 ranges between 2000 nm and 10000 nm. In this embodiment, the thickness of the first current spreading layer 104 ranges from 5 μm to 9 μm, which ensures an even current distribution. The first current spreading layer 104 may have a composition that is represented by $Al_{x1}Ga_{1-x1}As$ with $0 \leq x_1 \leq 0.3$. The first current spreading layer 104 is n-type doped and has a doping concentration ranging from $1E17/cm^3$ to $4E18/cm^3$.

In the semiconductor epitaxial structure, the first cladding layer 105 and the second cladding layer 109 independently have different doping types. Through various designs of dopants, the first cladding layer 105 and the second cladding layer 109 may be n-type doped and p-type doped. In this embodiment, the first cladding layer 105 is an n-type layer that provides electrons. The second cladding layer 109 is a p-type layer that provides holes. A bandgap of the first cladding layer 105 and a bandgap of the second cladding layer 109 are both greater than a bandgap of the active layer 107. The first cladding layer 105 may be doped with silicon or tellurium to become an n-type doping layer. The second cladding layer 109 may be doped with carbon or magnesium to become a p-type doping layer. In this embodiment, the first cladding layer 105 has a composition that is represented by $Al_{y1}Ga_{1-y1}As$ with $0.3 \leq y_1 \leq 0.5$. The first cladding layer 105 has the n-type doping concentration ranging from $1E17/cm^3$ to $4E18/cm^3$, and has a thickness ($t_3$) ranging from 300 nm to 1000 nm. The second cladding layer 109 has a composition that is represented by $Al_{y2}Ga_{1-y2}As$ with $0.3 \leq y_2 \leq 0.5$. In this embodiment, the second cladding layer 109 has the p-type doping concentration ranging from $1E17/cm^3$ to $4E18/cm^3$, and has a thickness ranging from 300 nm to 1000 nm.

The first confinement layer 106 is disposed between the first cladding layer 105 and the active layer 107. The first confinement layer 106 is not doped, so as to prevent dopants of the first cladding layer 105 from diffusing into the active layer 107 and to improve the quality of lattice of the active layer 107. In some embodiments, a bandgap of the first confinement layer 106 is smaller than that of the first cladding layer 105 and greater than that of the active layer 107. That is to say, an aluminum content of the first confinement layer 106 is less than that of the first cladding layer 105. Such bandgap design may enable the electrons to enter into the active layer 107 to be recombined with the holes. In this embodiment, the first confinement layer 106 has a composition that is represented by $Al_{z1}Ga_{1-z1}As$ with $0 \leq z_1 \leq 0.3$, and has a thickness ranging from 100 nm to 1000 nm.

This first transition layer 112 is disposed between the first current spreading layer 104 and the first cladding layer 105, and the second transition layer 113 is disposed between the first cladding layer 105 and the first confinement layer 106.

An aluminum content of the first transition layer 112 increases gradually in a direction (i.e., a thickness direction) from the first current spreading layer 104 to the first cladding layer 105. The first transition layer 112 has a composition that is represented by $Al_{u1}Ga_{1-u1}As$ with $0 < u_1 < 1$, $x_1 < u_1 < y_1$, and $y_1 - x_1 \geq 0.15$. The first transition layer 112 has a doping concentration ranging from $1E17/cm^3$ to $4E18/cm^3$ and a thickness ranging from 50 nm to 100 nm.

Figures 3, 4:
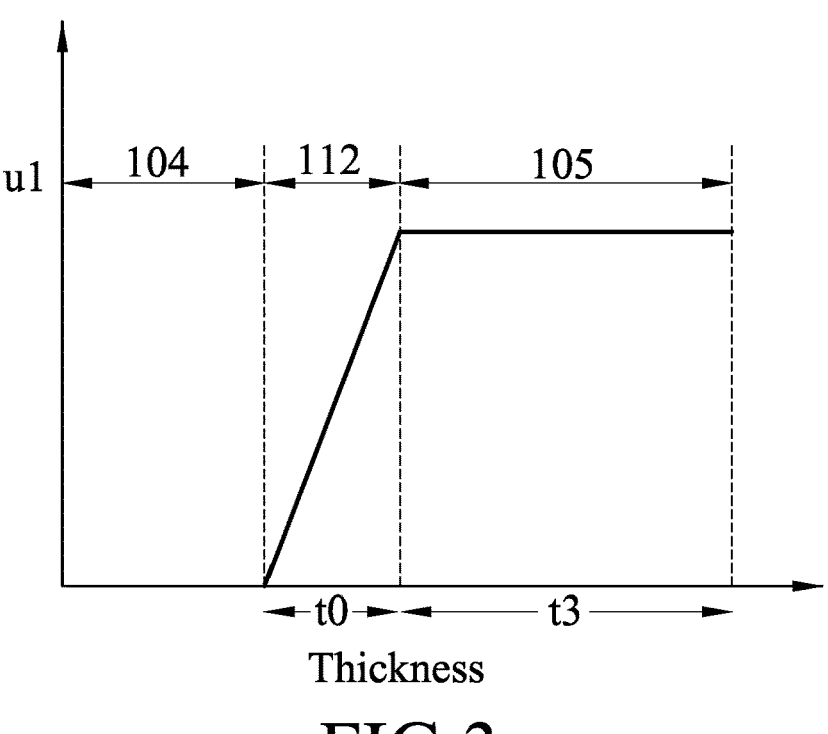
FIG. 3 and FIG. 4 are graphs illustrating an aluminum content of a first transition layer of the first embodiment.

In certain embodiments, the aluminum content of the first transition layer 112 increases along the thickness direction in a linear or stepwise manner. Specifically, FIG. 3 demonstrates the aluminum content of the first transition layer 112 increasing in a linear manner, wherein the first transition layer 112 has a thickness of to and may be viewed as a single layer that has the aluminum content increasing along the thickness direction linearly. On the other hand, FIG. 4 demonstrates the aluminum content of the first transition layer 112 increasing in a stepwise manner, wherein the first transition layer 112 may be multi-layered such as having at least two or more layers. In certain embodiments, the first transition layer 112 has nine sublayers (i.e., first to ninth sublayers), and each sublayer may be represented by $Al_{u1}Ga_{1-u1}As$, wherein the value of $u_1$ of the first sublayer increases linearly from 0 to $a_1$, and the value of $u_1$ of the second sublayer equals to $a_1$; the value of $u_1$ of the third sublayer increases linearly from $a_1$ to $a_2$, and the value of $u_1$ of the fourth sublayer equals to $a_2$; the value of $u_1$ of the fifth sublayer increases linearly from $a_2$ to as, and the value of $u_1$ of the sixth sublayer equals to $a_3$; the value of $u_1$ of the seventh sublayer increases linearly from as to $a_4$, and the value of $u_1$ of the eighth sublayer equals to $a_4$; the value of $u_1$ of the ninth sublayer increases linearly from $a_4$ to as, and as equals to $y_1$.

To form the first transition layer 112 with the gradually increased aluminum content, during formation of the $Al_{u1}Ga_{1-u1}As$ layer, a supply rate of aluminum may be increased in a linear or stepwise manner. In an embodiment, in the $Al_{u1}Ga_{1-u1}As$ layer, $u_1$ is increased from 0.2 to 0.5.

An aluminum content of the second transition layer 113 decreases gradually in the thickness direction from the first cladding layer 105 to the first confinement layer 106. The second transition layer 113 has a composition that is represented by $Al_{v1}Ga_{1-v1}As$ with $0 < v_1 < 1$, $z_1 < v_1 < y_1$, and $y_1 - z_1 \geq 0.15$. The second transition layer 113 has a doping concentration ranging from $1E17/cm^3$ to $4E18/cm^3$ and a thickness ranging from 50 nm to 100 nm. In certain embodiments, the aluminum content of the second transition layer 113 decreases along the thickness direction in a linear or stepwise manner.

The active layer 107 is a light emitting area for the electrons and the holes to recombine. Depending on a wavelength of light emitted by the active layer 107, materials for the active layer 107 may vary. The active layer 107 may be a single quantum well or multiple quantum wells with a periodic structure. The active layer 107 includes a well layer and a barrier layer, and a bandgap of the barrier layer is greater than that of the well layer. By adjusting a composition of the semiconductor material of the active layer 107, when the electrons and the holes recombine, the light having a pre-determined wavelength is emitted. The material of the active layer 107, such as InGaAs or AlGaAs, exhibits electroluminescence property. In some embodiments, the active layer 107 is made of indium gallium arsenide with a single quantum well or multiple quantum wells. In this embodiment, the semiconductor epitaxial structure emits an infrared light that has a peak wavelength ranging from 750 nm to 1000 nm.

The second confinement layer 108 is disposed between the active layer 107 and the second cladding layer 109. The second confinement layer 108 is not doped, so as to prevent dopants in the second cladding layer 109 from diffusing into the active layer 107 and to improve the quality of lattice of the active layer 107. In some embodiments, a bandgap of the second confinement layer 108 is smaller than that of the second cladding layer 109 and greater than that of the active layer 107. That is to say, an aluminum content of the second confinement layer 108 is less than that of the second cladding layer 109. Such bandgap design may facilitate the holes to enter into the active layer 107 to be recombined with the electrons. In this embodiment, the second confinement layer 108 has a composition that is represented by $Al_{z2}Ga_{1-z2}As$ with $0 \leq z_2 \leq 0.3$, and has a thickness ranging from 100 nm to 1000 nm.

The second current spreading layer 110 performs a function of current spreading, and the effectiveness of the current spreading function is related to a thickness of the second current spreading layer 110. In this embodiment, the thickness of the second current spreading layer 110 may vary based on the size of the light-emitting diode, and the thickness of the second current spreading layer 110 may range from 0 μm to 3 μm so as to ensure an even current distribution. The second current spreading layer 110 has a composition that is represented by $Al_{y2}Ga_{1-y2}As$ with $0 \leq y_2 \leq 0.3$. The second current spreading layer 110 is p-type doped and has a doping concentration ranging from $1E17/cm^3$ to $4E18/cm^3$.

Figure 5:
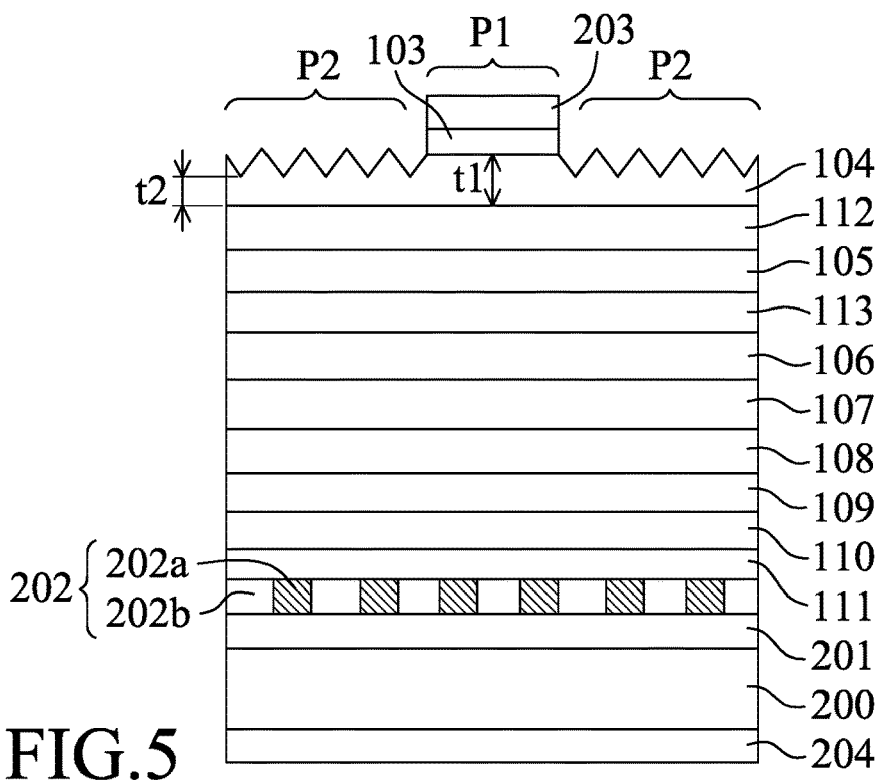
FIG. 5 is a schematic view illustrating a first embodiment of a light-emitting diode according to the disclosure.

A second ohmic contact layer 111 forms an ohmic contact with a second electrode 204 as shown in FIG. 5. In some embodiments, the second ohmic contact layer 111 is made of gallium phosphide and has a doping concentration no smaller than $5E18/cm^3$. In other embodiments, the doping concentration of the second ohmic contact layer 111 is greater than $1E19/cm^3$ so as to achieve better ohmic contact. The second ohmic contact layer 111 may also have a thickness ranging from 30 nm to 100 nm. In this embodiment, the second ohmic contact layer 111 has a thickness of 50 nm.

Referring to FIG. 5, a first embodiment of a light-emitting diode according to the disclosure adopts the semiconductor epitaxial structure as shown in FIG. 2. The light-emitting diode includes a substrate 200, the semiconductor epitaxial structure, a bonding layer 201 bonding the semiconductor epitaxial structure to the substrate 200, a first electrode 203, and the second electrode 204. The semiconductor epitaxial structure includes the second ohmic contact layer 111, the second current spreading layer 110, the second cladding layer 109, the second confinement layer 108, the active layer 107, the first confinement layer 106, the second transition layer 113, the first cladding layer 105, the first transition layer 112, the first current spreading layer 104, and the first ohmic contact layer 103 sequentially disposed on the substrate 200 in such order in a bottom-top direction.

The substrate 200 is a conductive substrate and may be made of silicon, silicon carbide or metal. Examples of the metal include copper, tungsten, molybdenum, etc. In some embodiments, the substrate 200 has a thickness no smaller than 50 μm so as to have sufficient mechanical strength to support the semiconductor epitaxial structure. In addition, to facilitate further mechanical processing of the substrate 200 after bonding the substrate 200 to the semiconductor epitaxial structure, the substrate 200 may have a thickness that is no greater than 300 μm. In this embodiment, the substrate 200 is a silicon substrate.

The first electrode 203 is disposed on the first ohmic contact layer 103. The first electrode 203 and the first ohmic contact layer 103 form an ohmic contact to allow an electric current to pass therethrough. During formation of the light emitting diode, the first ohmic contact layer 103 is etched to maintain a portion of the first ohmic contact layer 103 located right below the first electrode 203. The first current spreading layer 104 includes two portions in a horizontal direction perpendicular to the bottom-top direction: a first portion (P1) that is located right below the first ohmic contact layer 103 and the first electrode 203 (i.e., the portion covered by the first ohmic contact layer 103 and the first electrode 203), and a second portion (P2) that is not located right below the first electrode 203 (i.e., the portion not covered by the first ohmic contact layer 103 and the first electrode 203). The second portion (P2) has a light-exiting surface that is not covered by and exposed from the first ohmic contact layer 103 and the first electrode 203. The light-exiting surface may surround the first electrode 203 and be a patterned surface or a roughened surface obtained via etching. The roughened surface may have a regular or an arbitrarily irregular micro/nanostructure. The light-exiting surface that is patterned or roughened facilitates an exit of light, so as to increase the luminous efficiency of the light-emitting diode. In some embodiments, the light-exiting surface is a roughened surface that has a roughened structure with a height difference (between the highest and lowest point of the roughened structure) of less than 1 μm, e.g., from 10 nm to 300 nm.

Of the first current spreading layer 104, the first portion (P1) has a contact surface that is in contact with the first ohmic contact layer 103. The contact surface is not roughened because the contact surface is protected by the first electrode 203. The roughened surface of second portion (P2) of the first current spreading layer 104 is relatively lower than the contact surface of the first portion (P1) on a horizontal level.

Specifically, as shown in FIG. 5, in this embodiment, the first portion (P1) has a first thickness ($t_1$), and the second portion (P2) has a second thickness ($t_2$). In certain embodiments, the first thickness ($t_1$) ranges from 1.5 μm to 2.5 μm, and the second thickness ($t_2$) ranges from 0.5 μm to 1.5 μm. The first thickness ($t_1$) of the first portion (P1) is greater than the second thickness ($t_2$) of the second portion (P2). In some embodiments, the first thickness ($t_1$) is greater than the second thickness ($t_2$) by at least 0.3 μm.

The light-emitting diode may further include a mirror layer 202 that is disposed between the semiconductor epitaxial structure and the substrate 200. The mirror layer 202 includes a p-type ohmic contact metal layer 202a and a dielectric layer 202b. On one hand, the p-type ohmic contact metal layer 202a and the dielectric layer 202b cooperate with the second ohmic contact layer 111 to form an ohmic contact. On the other hand, the p-type ohmic contact metal layer 202a and the dielectric layer 202b reflect the light emitted by the active layer 107 toward the light-exiting surface of the first current spreading layer 104 or a side wall of the semiconductor epitaxial structure so as to facilitate the exit of light.

The second electrode 204 may be disposed on the substrate 200 at a side where the semiconductor epitaxial structure is disposed or at a side opposite to the semiconductor epitaxial structure.

Each of the first electrode 203 and the second electrode 204 may be made of a transparent conductive material or a metal material. When each of the first electrode 203 and the second electrode 204 is made of a transparent conductive material, each of the first electrode 203 and the second electrode 204 is formed as a transparent conductive layer. The transparent conductive material may be indium tin oxide (ITO) or indium zinc oxide (IZO). The metal material may be GeAuNi, AuGe, AuZn, Au, Al, Pt, and Ti, and combinations thereof.

In summary, in the first embodiment, by disposing the first transition layer 112 between the first current spreading layer 104 and the first cladding layer 105, and the second transition layer 113 between the first cladding layer 105 and the first confinement layer 106, the stress and defects between the layers due to lattice mismatch therebetween are greatly reduced.

Figure 6:
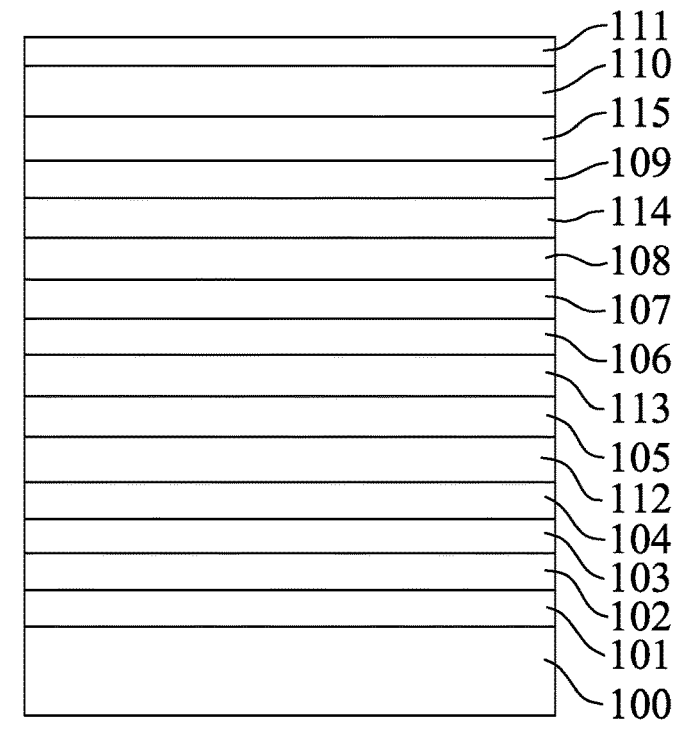
FIG. 6 is a schematic view illustrating a second embodiment of the light-emitting unit containing the semiconductor epitaxial structure according to the disclosure.

FIG. 6 illustrates a second embodiment of the light-emitting unit according to the disclosure. The differences between the second embodiment and the first embodiment reside in that the semiconductor epitaxial structure of the light-emitting unit of the second embodiment further includes a third transition layer 114 disposed between the second confinement layer 108 and the second cladding layer 109, and a fourth transition layer 115 disposed between the second cladding layer 109 and the second current spreading layer 110.

Aluminum contents of the second confinement layer 108, the second cladding layer 109, and the second current spreading layer 110 are different, which causes lattice mismatch and relative large bandgap difference, and in turn leads to large stress between the layers, such that a large amount defect exists between the second confinement layer 108 and the second cladding layer 109, and between the second cladding layer 109 and the second current spreading layer 110. With the a third transition layer 114 and the fourth transition layer 115, the problems of lattice mismatch and large stress may be eliminated, thereby reducing defects between the second confinement layer 108 and the second cladding layer 109, and between the second cladding layer 109 and the second current spreading layer 110.

In certain embodiments, when growing the third transition layer 114, an aluminum content of the third transition layer 114 may be adjusted by controlling an amount of aluminum introduced to the third transition layer 114. The aluminum content of the third transition layer 114 increases in a direction from the second confinement layer 108 to the second cladding layer 109 in a linear manner.

In other embodiments, the aluminum content of the third transition layer 114 increases in the direction from the second confinement layer 108 to the second cladding layer 109 in a stepwise manner.

In some embodiments, an aluminum content of the fourth transition layer 109 decreases in a direction from the second cladding layer 109 to the second current spreading layer 110. In certain embodiments, the aluminum content of the fourth transition layer 109 decreases along the thickness direction in a linear or stepwise manner.

In certain embodiments, each of the third transition layer 114 and the fourth transition layer 115 may have a thickness ranging from 50 nm to 100 nm.

In summary, in the second embodiment, the stress and defects between the layers due to lattice mismatch therebetween are greatly reduced by disposing the third transition layer 114 between the second confinement layer 108 and the second cladding layer 109, and the fourth transition layer 115 between the second cladding layer 109 and the second current spreading layer 110.

Figure 7:
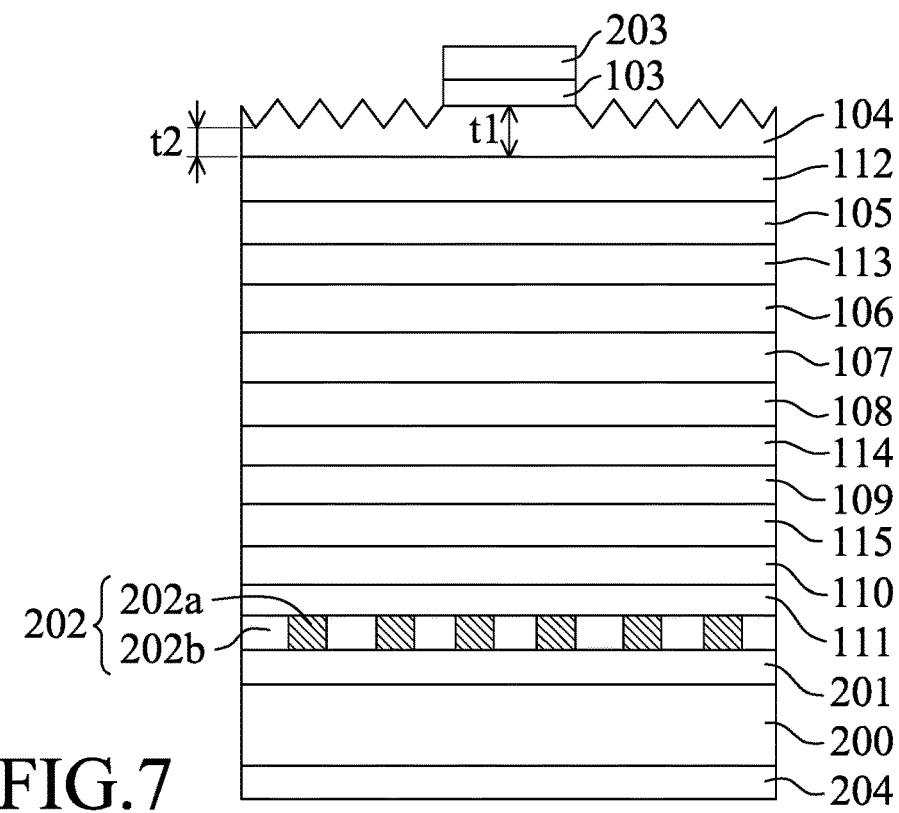
FIG. 7 is a schematic view illustrating a second embodiment of the light-emitting diode according to the disclosure.

FIG. 7 illustrates a second embodiment of the light-emitting diode according to the disclosure containing the semiconductor epitaxial structure as shown in FIG. 6.

Similar to the first embodiment of the light-emitting diode, the second embodiment of the light-emitting diode also includes the substrate 200, the bonding layer 201, the mirror layer 202, the first electrode 203 and the second electrode 204. A production method of the light-emitting diode is provided below.

First, referring to FIG. 6, the growth substrate 100 is provided and may be made of gallium arsenide. By using an epitaxy process, such as metal-organic chemical vapor deposition (MOCVD), the semiconductor epitaxial structure is grown on the growth substrate 100. The semiconductor epitaxial structure includes the buffer layer 101, the etch stop layer 102 for removing the growth substrate 100, the first ohmic contact layer 103, the first current spreading layer 104, the first transition layer 112, the first cladding layer 105, the second transition layer 113, the first confinement layer 106, the active layer 107, the second confinement layer 108, the third transition layer 114, the second cladding layer 109, the fourth transition layer 115, the second current spreading layer 110, and the second ohmic contact layer 111 sequentially disposed in such order on the growth substrate 100.

Figure 8:
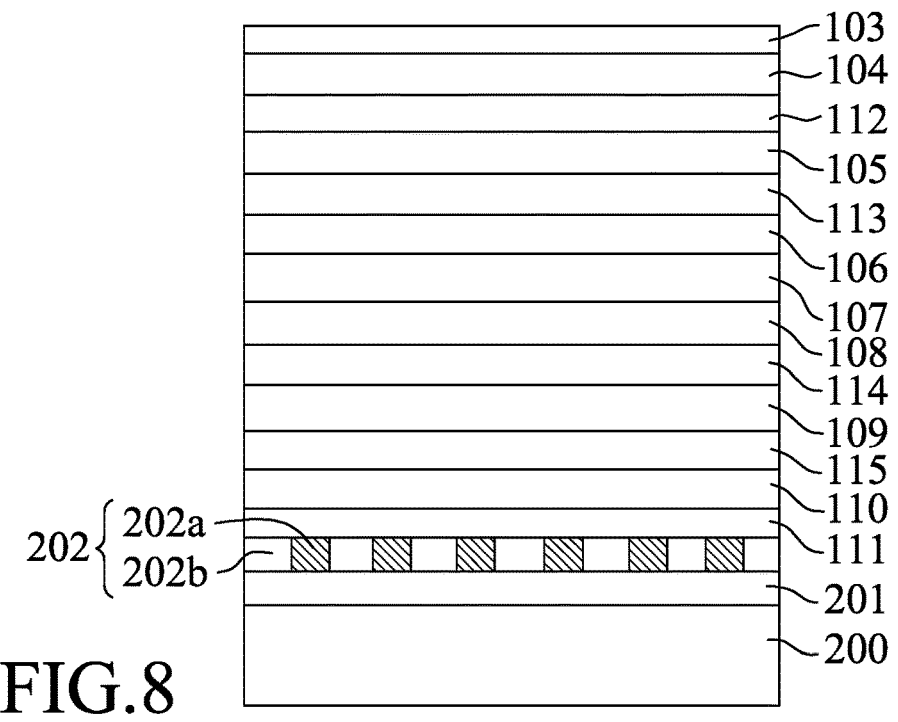
FIG. 8 and FIG. 9 are schematic views illustrating a production method of the light-emitting diode shown in FIG. 7.

Next, the semiconductor epitaxial structure is transferred to the substrate 200 and the growth substrate 100 is removed to obtain a structure as shown in FIG. 8. The steps include: forming the mirror layer 202 on the second ohmic contact layer 111 opposite to the second current spreading layer 110, where the mirror layer 202 includes the p-type ohmic contact metal layer 202a and the dielectric layer 202b; providing the substrate 200; disposing the bonding layer 201 on the substrate 200; bonding the substrate 200 with the mirror layer 202 through the bonding layer 201; and removing the growth substrate 100. In cases where the growth substrate 100 is made of gallium arsenide, the growth substrate may be removed by wet etching until the first ohmic contact layer 103 is revealed.

Figure 9:
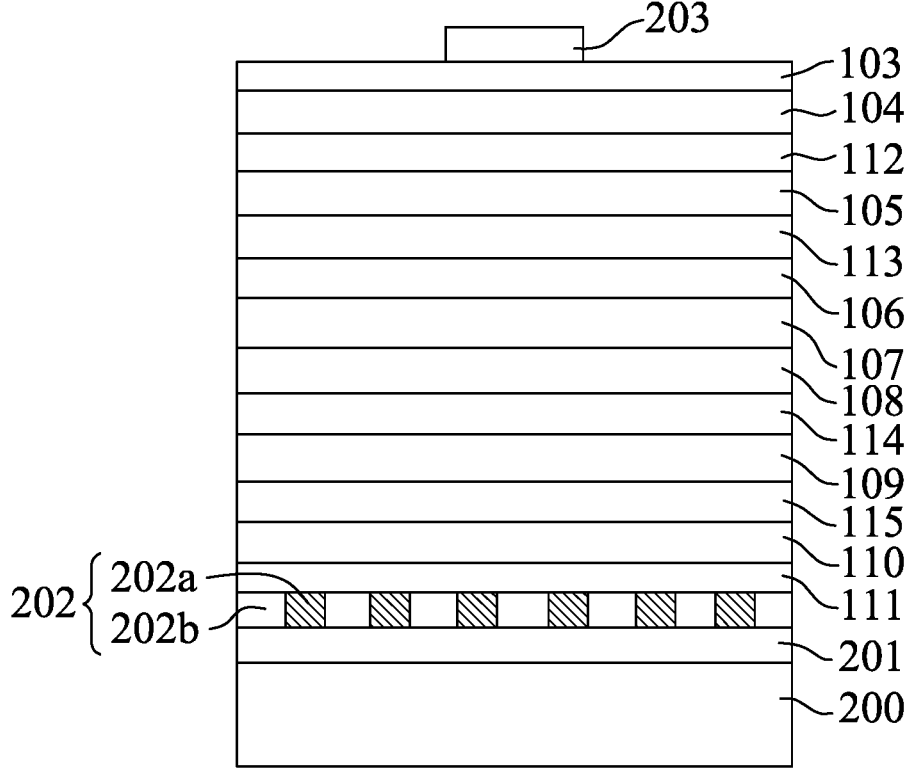

Next, referring to FIG. 9, the first electrode 203 is formed on the first ohmic contact layer 103, and the second electrode 204 is formed on the substrate 200 opposite to the semiconductor epitaxial structure. A good ohmic contact is then established between the first electrode 203 and the first ohmic contact layer 103 so a conductive current may pass through the first electrode 203, the second electrode 204, and the semiconductor epitaxial structure. In addition, the substrate 200 has a pre-determined thickness that is capable of supporting the semiconductor epitaxial structure.

Then, a mask (not shown) is formed to cover the first electrode 203, and a portion of the first ohmic contact layer 103 that is not covered by and surrounds the first electrode 203 is left exposed. Next, etching is performed to remove the portion of the first ohmic contact layer 103 that is left exposed, so that the first current spreading layer 104 is revealed. Afterwards, the first current spreading layer 104 is etched to form a patterned or roughened surface as shown in FIG. 7. It should be noted that the removal of the first ohmic contact layer 103 and the roughening of the first current spreading layer 104 may be conducted by wet etching in one step or multiple steps. Solutions used for wet etching may be acidic, such as hydrochloric acid, sulfuric acid, hydrofluoric acid, citric acid, or other chemical reagents. Finally, depending on requirements, processes such as etching or dicing are performed to obtain a plurality of unitized light-emitting diode.

In summary, by disposing the first transition layer 112 between the first current spreading layer 104 and the first cladding layer 105, the second transition layer 113 between the first cladding layer 105 and the first confinement layer 106, the third transition layer 114 between the second confinement layer 108 and the second cladding layer 109, and the fourth transition layer 115 between the second cladding layer 109 and the second current spreading layer 110, lattice mismatch between the different layers and epitaxial defects generated by stress therebetween are reduced, thereby improving the performance of the light-emitting diode in withstanding exposures to high and low temperature extremes under a power and temperature cycling test, and the lighting efficiency and lifespan thereof.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode, comprising:
a semiconductor epitaxial structure that has a first surface and a second surface opposite to said first surface, and that includes a first current spreading layer, a first transition layer, a first cladding layer, a second transition layer, a first confinement layer, an active layer, a second confinement layer, a second cladding layer-and a second current spreading layer disposed sequentially in such order from said first surface to said second surface,
wherein
said first current spreading layer, said first cladding layer and said first confinement layer-independently have semiconductor materials that are different in an aluminum content,
said first transition layer has aluminum, and an aluminum content of said first transition layer gradually increases from an interface of said first transition layer with said first current spreading layerto an interface of said first transition layer with said first cladding layer,
said second transition layer has aluminum, and an aluminum content of said second transition layer gradually decreases from an interface of said second transition layer with said first cladding layerto an interface of said second transition layer with said first confinement layer, and
said aluminum content of said first confinement layer is smaller than said aluminum content of said first cladding layer.

2. The light-emitting diode according to claim 1, wherein the aluminum content of said first transition layer-increases in the direction from said first current spreading layerto said first cladding layer in a linear manner.

3. The light-emitting diode according to claim 1, wherein the aluminum content of said first transition layer (112) increases in the direction from said first current spreading layer (104) to said first cladding layer (105) in a stepwise manner.

4. The light-emitting diode according to claim 1, wherein the aluminum content of said second transition layer decreases in the direction from said first cladding layer to said first confinement layerin a linear manner.

5. The light-emitting diode according to claim 1, wherein the aluminum content of said second transition layer (113) decreases in the direction from said first cladding layer (105) to said first confinement layer (106) in a stepwise manner.

6. The light-emitting diode according to claim 1, wherein said first transition layer (112) has a thickness ranging from 50 nm to 100 nm.

7. The light-emitting diode according to claim 1, wherein said second transition layer (113) has a thickness ranging from 50 nm to 100 nm.

8. The light-emitting diode according to claim 1, wherein said first current spreading layer has a composition represented by $Al_{x1}Ga_{1-x1}As$, said first cladding layer has a composition represented by $Al_{y1}Ga_{1-y1}As$, said first confinement layer has a composition represented by $Al_{z1}Ga_{1-z1}As$, said first transition layer has a composition represented by $Al_{u1}Ga_{1-u1}As$, and said second transition layer has a composition represented by $Al_{v1}Ga_{1-v1}As$, wherein $x_1 < u_1 < y_1$, $z_1 < v_1 < y_1$.

9. The light-emitting diode according to claim 8, wherein $y_1 - x_1 > 0.15$, $y_1 - z_1 \geq 0.15$.

10. The light-emitting diode according to claim 1, wherein said semiconductor epitaxial structure further includes a third transition layer (114) disposed between said second confinement layer (108) and said second cladding layer (109), and a fourth transition layer (115) disposed between said second cladding layer (109) and said second current spreading layer (110), and said third transition layer (114) has aluminum, and in said third transition layer (114), an aluminum content increases in a direction from said second confinement layer (108) to said second cladding layer (109), said fourth transition layer (115) has aluminum, and in said fourth transition layer (115), an aluminum content decreases in a direction from said second cladding layer (109) to said second current spreading layer (110).

11. The light-emitting diode according to claim 10, wherein the aluminum content of said third transition layer (114) increases in the direction from said second confinement layer (108) to said second cladding layer (109) in a linear manner.

(114) increases in the direction from said second confinement layer (108) to said second cladding layer (109) in a linear manner.

12. The light-emitting diode according to claim 10, wherein the aluminum content of said third transition layer (114) increases in the direction from said second confinement layer (108) to said second cladding layer (109) in a stepwise manner.

13. The light-emitting diode according to claim 10, wherein the aluminum content of said fourth transition layer (115) decreases in the direction from said second cladding layer (109) to said second current spreading layer (110) in a linear manner.

14. The light-emitting diode according to claim 10, wherein the aluminum content of said fourth transition layer (115) decreases in the direction from said second cladding layer (109) to said second current spreading layer (110) in a stepwise manner.

15. The light-emitting diode according to claim 10, wherein said third transition layer (114) has a thickness ranging from 50 nm to 100 nm.

16. The light-emitting diode according to claim 10, wherein said fourth transition layer (115) has a thickness ranging from 50 nm to 100 nm.

17. The light-emitting diode according to claim 1, wherein said light-emitting diode emits invisible light having a wavelength ranging from 750 nm to 1000 nm.

\* \* \* \* \*